(12) United States Patent
Nagasaka et al.

(10) Patent No.: US 7,271,460 B2
(45) Date of Patent: Sep. 18, 2007

(54) SOLID-STATE IMAGE SENSING DEVICE, MANUFACTURING METHOD AND ATTACHMENT METHOD THEREOF, IMAGING APPARATUS AND IMAGE READ UNIT FOR IMAGING APPARATUS

(75) Inventors: Hideaki Nagasaka, Nagoya (JP); Yoshinori Osakabe, Seto (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 150 days.

(21) Appl. No.: 10/876,513

(22) Filed: Jun. 28, 2004

(65) Prior Publication Data
US 2005/0029612 A1 Feb. 10, 2005

(30) Foreign Application Priority Data
Jun. 30, 2003 (JP) ............................. 2003-188189
Dec. 25, 2003 (JP) ............................. 2003-430840

(51) Int. Cl.
*H01L 31/0232* (2006.01)
(52) U.S. Cl. ................. 257/432; 257/433; 257/E31.117
(58) Field of Classification Search ............... 257/432, 257/433, E31.117
See application file for complete search history.

(56) References Cited

U.S. PATENT DOCUMENTS 6,420,204 B2 * 7/2002 Glenn ........................ 438/64
6,599,770 B2 * 7/2003 Miyamoto .................... 438/48
6,958,298 B2 * 10/2005 Murayama .................. 438/759
7,095,089 B2 * 8/2006 Yagi et al. .................... 256/433
2002/0101527 A1 * 8/2002 Endo .......................... 348/302
2002/0167062 A1 * 11/2002 Narita ......................... 257/433

FOREIGN PATENT DOCUMENTS

| JP | U-64-30839 | 2/1989 |
|---|---|---|
| JP | B2 2891170 | 2/1999 |
| JP | A 2000-58805 | 2/2000 |

* cited by examiner

*Primary Examiner*—T. N. Quach
(74) *Attorney, Agent, or Firm*—Oliff & Berridge, PLC

(57) ABSTRACT

A solid-state image sensing device is provided which saves the effort of removing adhesives from a cover glass and is capable of reading an image without being affected by adhesive residuals. In a solid-state image sensing device, defacement of a cover glass upon the transport, etc. is prevented by having a protective film adhere to the surface of the cover glass. The adhesion section between the cover glass and the protective film is provided so as to keep clear of the front face of a light-receiving section. Therefore, after the protective film is detached, even without conventional surface processing like cleaning the cover glass, the light received by the light-receiving section entering through the cover glass is not adversely affected by residual adhesives.

19 Claims, 13 Drawing Sheets

SOLID-STATE IMAGE SENSING DEVICE, MANUFACTURING METHOD AND ATTACHMENT METHOD THEREOF, IMAGING APPARATUS AND IMAGE READ UNIT FOR IMAGING APPARATUS

BACKGROUND OF THE INVENTION (i) Field of the Invention

The present invention relates to a solid-state image sensing device provided with a light-receiving section that generates electric signals when subjected to light. More particularly, the present invention relates to the solid-state image sensing device including a translucent or transparent cover member that covers the light-receiving section from the light receiving side and a protective film that is made to adhere to the surface of the light-receiving side of the cover member in a detachable manner, the manufacturing method and attachment method thereof, and parts, apparatus, and equipment using the solid-state image sensing device. In the present invention, bonding or pasting a plurality of members together in a detachable manner is called adhesion. The bonds or pastes to be used for adhesion are called adhesives.

(ii) Description of the Related Art

A conventional solid-state image sensing device is provided with photoelectric conversion devices, such as CCDs (charge coupled devices), CIS (contact image sensors), CMOS (complementary metal oxide semiconductor) image sensors, etc. at the light-receiving section. The light-receiving section is covered with a translucent or transparent cover member (glass, for example) for protection. However, the cover member may be damaged or stained during the transport of the solid-state image sensing device or assembling the device to a printed-circuit board by reflow soldering and the like. Accordingly, it has been considered to adhere a protective film to the cover member surface in a detachable manner so that the cover member can be protected until the solid-state image sensing device is fitted to an apparatus, as described in Japanese Patent Publication No. 2000-58805.

SUMMARY OF THE INVENTION

However, adhesives are conventionally applied to the whole surface area of the protective film for adhesion onto the cover member. Therefore, the adhesives are often left stuck everywhere on the cover member surface when the protective film is taken off. When the adhesives are left on the surface of the cover member which covers the light-receiving section, a photoelectric conversion device, like a scanning-type line sensor, provided at a portion where the adhesives are stuck, is not able to correctly read an image. If an image (draft, etc.) is read under such conditions with white balance correction applied, the photoelectric conversion device recognizes the portions where the reflected light is blocked by the adhesives as "white" and thus a white streak shows up on the read image. Especially, in a CCD-type solid-state image sensing device, the distance between the photoelectric conversion device and the cover member is narrow. Accordingly, residuals of adhesives remaining on the cover member will cause a serious effect on image reading and cannot be ignored if each residual is as large as the size of one pixel of the CCD (i.e. a residual of the same size of one pixel is as large as 5.25 μm in width, for example).

Therefore, when the solid-state image sensing device is fitted to an apparatus, a process of removing the adhesives, that is, cleaning of the cover member surface after the protective film is detached from the cover member, is necessary. This process includes a series of surface processing by wiping with alcohol→rubbing with a dry cloth→blowing air, etc. However, such processing requires extra effort. Moreover, it is difficult to completely remove the adhesives.

For instance, let us assume that, as shown in FIG. 13A, adhesives 99 were left on the surface of the cover glass 10 used as a cover member. If the cover glass 10 is wiped with alcohol, the adhesives 99 were dissolved in alcohol. Drops 98 of alcohol were left on the surface of the cover glass 10 as shown in FIG. 13B. After the drops 98 were dried, residuals of the adhesives were slightly left as shown in FIG. 13C. Even if the surface of the cover glass 10 is rubbed with a dry cloth, the residuals extend in a direction of the rub as shown in FIG. 13D. The adhesives 99 can hardly be completely removed. In general, the process of blowing air, etc. is further conducted to remove the adhesives 99 left on the surface of the cover glass 10 and also remove cloth waste attached on the cover glass 10 upon rubbing. However, this process takes much trouble. Specifically, the CCD-type solid-state image sensing device is automatically mounted on the printed-circuit board by reflow soldering. Therefore, the adhesives 99 are heated at the time of the automatic mounting, which makes it much more difficult for the adhesives 99 to be removed.

An object of the present invention is to provide a solid-state image sensing device that saves the effort of removing adhesives left on the cover glass and that is capable of reading an image without being affected by residuals of the adhesives. Another object is to provide manufacturing and attaching methods of the solid-state image sensing device mentioned above. A further object of the present invention is to provide an imaging apparatus provided with the aforementioned solid-state image sensing device and an image read unit for the imaging apparatus.

In order to attain the above objects, one aspect of the present invention provides a solid-state image sensing device comprising a light-receiving section that generates electric signals when subjected to light, a translucent or transparent cover member that covers the light-receiving section from the light-receiving side, and a protective member that adheres to the surface of the light-receiving side of the cover member in a detachable manner. An adhesion section between the cover member and the protective member is provided on a circumferential area of the cover member avoiding the front face of the light-receiving section.

In the present invention, the adhesion section between the cover member and the protective member is provided on the circumferential area of the cover member, keeping clear of the front face of the light-receiving section. Therefore, even if no surface processing, such as cleaning of the cover member, etc., is performed, the light entering through the cover member and received by the light-receiving section is not affected by the residual adhesives. Accordingly, in the present invention, the effort of removing the adhesives from the cover member surface can be dispensed with upon mounting the solid-state image sensing device on the apparatus. Moreover, even if the removal of the residual adhesives is not performed, the light received by the light-receiving section is not affected by the residual adhesives. Image reading using the solid-state image sensing device of the present invention can be executed in a favorable manner.

Additionally, the present invention renders possible reduction of the manufacturing costs of the solid-state image sensing device in comparison with those of the conventional device. That is, as mentioned above, the adhesives are conventionally applied to the whole surface of the protective member, which is then made to adhere to the cover member. Accordingly, it is necessary to use adhesives having a property of leaving fewer residuals on the cover member surface upon detaching the protective member so that the entering light may not be blocked by the adhesives left on the cover surface facing the front face of the light-receiving section. However, such adhesives are relatively expensive. Thus, the costs for manufacturing the solid-state image sensing device were increased due to the costs of adhesives in the past. On the other hand, in the present invention the adhesion section is provided on a circumferential area of the cover member other than the front face of the light-receiving section, as mentioned above. Accordingly, even if a significant amount of adhesives are left on the cover member surface upon taking off the protective member, the light entering through the front face of the light-receiving device is not blocked by the residual adhesives, and thus the image reading using the device of the present invention can be performed satisfactorily. In other words, in the present invention, even if relatively cheap adhesives are used which leave a significant amount of residuals on the cover member surface upon detaching the protective member, the quality of image reading using the present solid-state image sensing device is not deteriorated. According to the present invention, it is possible to dispense with the effort of removing the residual adhesives as well as to reduce the manufacturing costs of the solid-state image sensing device, since inexpensive adhesives can be used and a wide range of choice of adhesives becomes available.

In the present invention, the adhesion section may be provided on the whole circumferential area of the cover member. In this manner, dust entering onto the front face of the light-receiving section from the circumferential area of the cover member can be effectively prevented. As a result, necessity of cleaning the cover member is all the more reduced and image reading using the solid-state image sensing device of the present invention can be even more favorable.

Moreover, in the solid-state image sensing device of the present invention, the adhesives may be applied to the cover member to make the protective member adhere onto the cover member, or the adhesives may be applied to the protective member to make the protective member adhere onto the cover member. Or, the adhesives may be applied to both the cover member and the protective member to make them adhere to each other.

Furthermore, in the solid-state image sensing device of the present invention, the protective member may comprise an outer protective film and an inner protective film. The adhesives may be applied at least to the surface of the outer protective film facing the circumferential area of the cover member, and the inner protective film without application of adhesives on at least one surface may be provided between the outer protective film and the cover member on the area of the outer protective film facing to the front face of the light-receiving section.

In this case, for example, even if the adhesives are roughly (coarsely or crudely) applied to the outer protective film, undesirable sticking of the adhesives to the front face of the light-receiving section in the cover member is prevented by the inner protective film. Accordingly, in this case, it is sufficient to apply the adhesives at least on the surface of the outer protective film facing to the circumferential area of the cover member. In other words, for example, the adhesives may be applied to the whole surface of the outer protective film. Even in that case, the same effect as previously described can be obtained, that is, use of the inner protective film can prevent the light to be received by the light-receiving section from being affected by the residual adhesives. In this case, manufacturing of the solid-state image sensing device can become even easier since close attention is not necessary to the area of application of the adhesives.

In case of using the inner protective film as such, the inner protective film may be arranged in such a manner that at least a part of the edge thereof protrudes from the cover member surface.

Then, by picking up the part of the inner protective film protruding from the cover member surface, the protective member (outer and inner protective films) can be easily taken off from the cover member.

Also in the solid-state image sensing device of the present invention, the outer protective film may adhere to the cover member in such a manner that at least a part of the edge of the outer protective film protrudes from the cover member surface.

Then, by picking up the part of the outer protective film protruding from the cover member surface, the protective member (outer and inner protective films, or outer protective film in a constitution where no inner protective film exists) can be easily taken off from the cover member.

In the solid-state image sensing device of the present invention, the light-receiving section may be composed of photoelectric conversion devices which correspond to line sensors or area sensors. In this case as well, the same effects as previously described can be obtained.

The "photoelectric conversion device" mentioned herein includes at least CCD (charge coupled device), CIS (contact image sensor) or CMOS (complementary metal oxide semiconductor) image sensor.

Moreover, in the conventional solid-state image sensing device, especially when the distance between the light-receiving section and the cover member is narrow, the influence of the residual adhesives was exerted all the more remarkable as mentioned previously. Also, in the conventional solid-state image sensing device, heat is applied to the residual adhesives upon automatically mounting the device onto the printed-circuit board. Therefore, removal of the adhesives is even more difficult. To the contrary, in the solid-state image sensing device of the present invention, the trouble required for removing the adhesives can be dispensed with as previously described. Furthermore, image reading using the present solid-state image sensing device is not affected by residual adhesives. Accordingly, for example, if the distance between the light-receiving section and the cover member is narrow (in case of the solid-state image sensing device composed of CCD as a photoelectric conversion device, for example), the aforementioned effects of the present invention are even more prominently produced.

Another aspect of the present invention provides a manufacturing method of a solid-state image sensing device of the present invention comprising a light-receiving section that generates electric signals when subjected to light, a translucent or transparent cover member which covers the light-receiving section from the light-receiving side, and inner and outer protective films that adhere to the surface of the light-receiving side of the cover member in a detachable manner. The method comprises the steps of: applying an adhesive to at least a part of a circumferential area of the cover member, arranging the inner protective film on a portion without the adhesive applied of the cover member, and disposing the outer protective film on the cover member on which the inner protective film is arranged, in such a manner that the inner protective film is arranged between the cover member and the outer protective film, to adhere the outer protective film to the cover member.

Alternatively, the method may comprise the steps of: applying an adhesive to at least a part of a circumferential area of the cover member, arranging the inner protective film on the outer protective film, and disposing the outer protective film on which the inner protective film is arranged on the cover member, in such a manner that the inner protective film is arranged between the cover member and the outer protective film, to adhere the outer protective film to the cover member.

Further alternatively, the method may comprise the steps of: arranging the inner protective film on the cover member, applying an adhesive to at least a part of a circumferential area of the outer protective film, and disposing the outer protective film with the adhesive on the cover member on which the inner protective film is arranged, in such a manner that the inner protective film is arranged between the cover member and the outer protective film, to adhere the outer protective film to the cover member.

Still further alternatively, the method may comprise the steps of: applying an adhesive to at least a part of a circumferential area of the outer protective film, arranging the inner protective film on a portion without the adhesive applied of the outer protective film, and disposing the outer protective film on which the inner protective film is arranged on the cover member, in such a manner that the inner protective film is arranged between the cover member and the outer protective film, to adhere the outer protective film to the cover member.

According to the manufacturing methods, the aforementioned solid-state image sensing device of the present invention can be obtained. Therefore, the manufacturing method can eliminate the trouble of removing the adhesives left on the cover member surface. Furthermore, using the solid-state image sensing device, satisfactory image reading is possible without being affected by the residual adhesives.

In the manufacturing method of the solid-state image sensing device of the present invention, the adhesion section may be provided on the whole circumferential area of the cover member.

Moreover, the adhesives may be applied to the cover member to make the outer protective film adhere onto the cover member, or the adhesives may be applied to the outer protective film to make the outer protective film adhere onto the cover member. Or, the adhesives may be applied to both the cover member and the outer protective film to make them adhere to each other.

In case of using the inner protective film in the manufacturing method of the solid-state image sensing device of the present invention, the inner protective film may be arranged in such a manner that at least a part of the edge of the inner protective film protrudes from the cover member surface.

Also, the outer protective film may adhere to the cover member in such a manner that at least a part of the edge of the outer protective film protrudes from the cover member surface.

Further another object of the present invention provides a method of attaching the solid-state image sensing device of the present invention to an attached section of an apparatus. In this attachment method, the protective member (outer and inner protective films, or outer protective film in a constitution where no inner protective film exists) is taken off from the surface of the light-receiving side of the cover member, and without applying any surface processing to the surface of the light-receiving side, the solid-state image sensing device is attached to the attached section of the apparatus.

As mentioned above, according to the solid-state image sensing device of the present invention, the light received by the light-receiving section through the cover member is not affected by the residual adhesives regardless of applying to the cover member any surface processing like cleaning. Thus, in the attachment method of the present invention, the protective member is detached from the surface of the light-receiving side of the cover member and without applying any surface processing to the surface of the light-receiving side, the solid-state image sensing device is attached to the attached section of the apparatus as previously described.

Therefore, according to the attachment method of the present invention, the attachment of the solid-state image sensing device to the apparatus becomes extremely simple without requiring the trouble of cleaning, etc. Furthermore, reduction of the manufacturing costs of the apparatus can be achieved. Also, in the attachment method of the present invention, the solid-state image sensing apparatus is attached to the attached section of the apparatus without application of any surface processing to the surface of the light-receiving side of the cover member. Thus, defacement of the cover member surface due to the surface processing can be prevented as well.

Here, the surface processing may include cleaning processes such as wiping with alcohol, rubbing with a dry cloth, blowing air, etc.

In this manner, the surface processing of the surface of the light-receiving side of the cover member can be omitted in the attachment method of the present invention. Accordingly, in this case, the omission of the surface processing allows simple attachment of the solid-state image sensing device to the apparatus. Moreover, the manufacturing costs of the apparatus can be reduced more effectively.

Yet another object of the present invention provides an imaging apparatus. The imaging apparatus adopts the solid-state image sensing device of the present invention. In this case, since the surface processing, like cleaning, to the cover member of the solid-state image sensing device is no longer necessary, reduction in manufacturing costs of the imaging apparatus can be fulfilled. Moreover, even without applying such surface processing, image reading using the imaging apparatus can be performed satisfactorily.

The imaging apparatus of the present invention may comprise an image read unit as an apparatus to which the solid-state image sensing device of the present invention is applied, a control section that controls the image read unit, and a chassis that accommodates the image read unit and the control section.

In this manner, owing to the cooperation between the solid-state image sensing device of the present invention and the control section, the image reading processing can be desirably executed.

The present imaging apparatus may correspond to image read apparatus like scanners, multifunctional apparatus (apparatus provided with at least two of the following functions: faxing, scanning, copying and printing), digital cameras, digital video cameras, and camera-equipped cellular phones, for example.

Still another aspect of the present invention provides an image read unit for the imaging apparatus of the present invention that adopts the solid-state image sensing device of the present invention. The image read unit functions as a part of the aforementioned imaging apparatus.

According to the image read unit of the present invention, manufacturing costs of the image read unit (and consequently, the imaging apparatus in which the image read unit is built in) can be reduced since no surface processing like cleaning is necessary to apply to the cover member of the solid-state image sensing device. Furthermore, without such surface processing, image reading using the image read unit can be satisfactorily performed.

The apparatus which correspond to the image read unit of the present invention includes a module to be incorporated into various apparatus corresponding to the aforementioned imaging apparatus, for example. Such a module includes, for example, a CCD module provided with CCDs in the light-receiving section of the solid-state image sensing device, a CIS module provided with CIS in the light-receiving section of the solid-state image sensing device, and a CMOS module provided with CMOS image sensors in the light-receiving section of the solid-state image sensing device.

BRIEF DESCRIPTION OF THE DRAWINGS

Embodiments of the present invention will be described hereinafter with reference to the drawings, in which.

BEST MODE FOR CARRYING OUT THE INVENTION

A solid-state image sensing device 1 to be used in the present embodiment is a so-called CCD solid-state image sensing device, which is provided with a plurality of line sensors 3 (see FIG. 2) including photoelectric conversion devices at the light-receiving section 5.

Figure 1A:
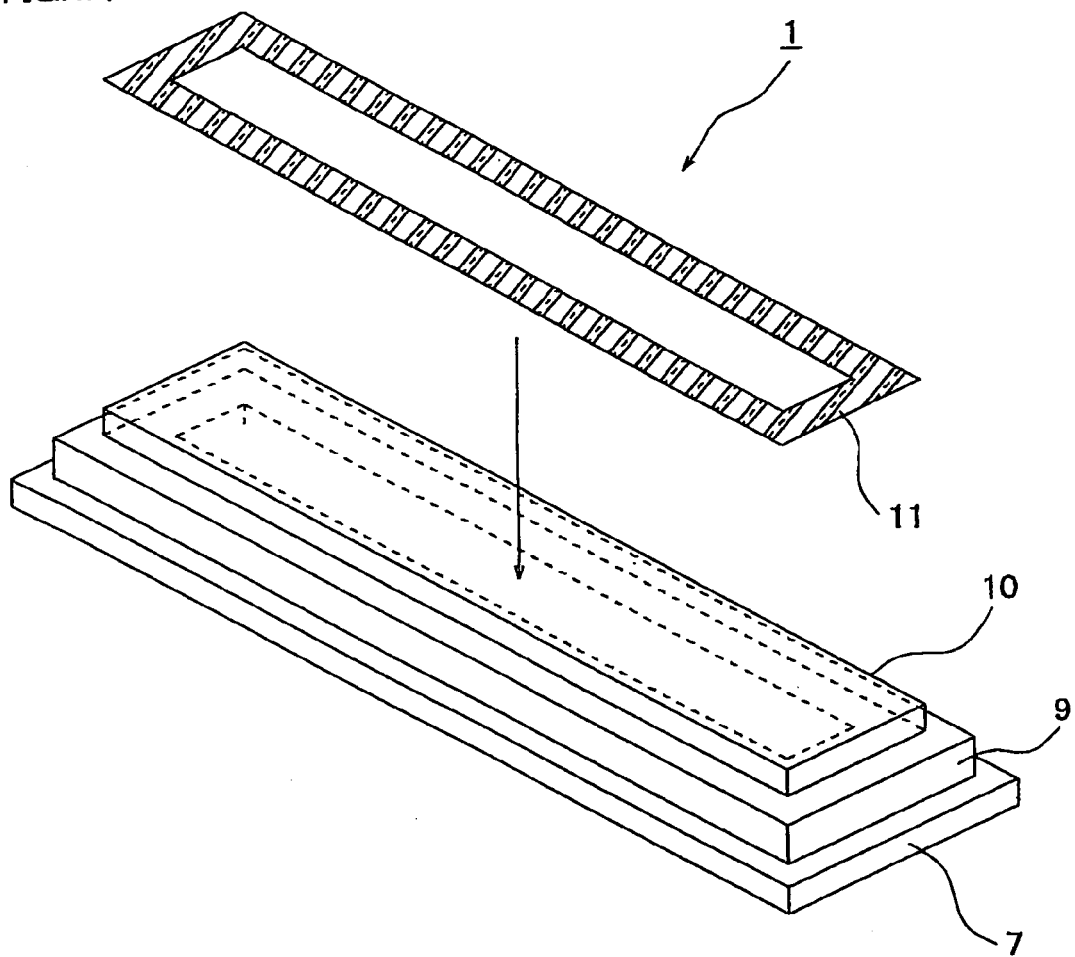
FIG. 1A is an exploded perspective view and FIG. 1B is a transverse sectional view showing a constitution of a solid-state image sensing device according to the present embodiment.
Figure 1B:
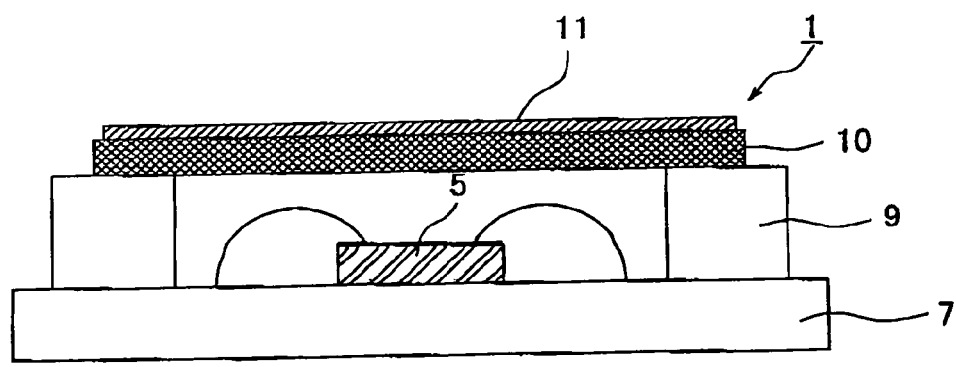

As shown in FIG. 1B, the light receiving section 5 is fixed on a base 7 on which a long rectangular frame 9 is also fixed surrounding the light-receiving section 5. On the surface of the frame 9, a long rectangular cover glass 10 made of borosilicate glass (commonly used for CCD glass) is fixed as a cover member. The base 7, frame 9, and cover glass 10, together create a sealed space which surrounds the light-receiving section 5.

A protective film 11 as a first protective film is made to adhere to the surface of the cover glass 10 using an adhesive in a detachable manner. Heat-resistant creped paper, heat-resistant polyimide film, and the like, are used as the protective film 11. For the adhesive, acrylic adhesives are used. As shown hatched in FIG. 1A, the adhesive is applied only to an area facing the frame 9 of the protective film 11. The adhesive may be of silicone, rubber or complex type.

Figure 2:
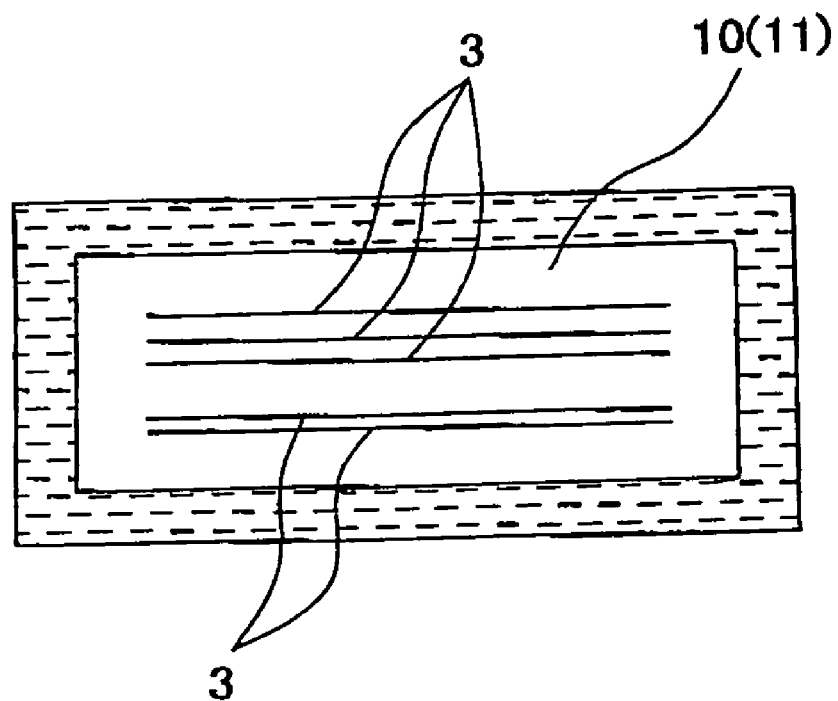
FIG. 2 is a plan view showing the constitution of the solid-state image sensing device.

The adhesive is, as shown hatched in FIG. 2, applied to the whole circumferential area of the cover glass 10, keeping clear of the front of the line sensors 3. In this embodiment, an Even channel and an Odd channel for each color of R (red), G (Green), B (Blue), and B/W (Black/White), are provided as the line sensors 3. The intervals between the respective line sensors 3 are 10.5 μm between REven and ROdd, 52.5 μm between ROdd and GEven, 10.5 μm between GEven and GOdd, 52.5 μm between GOdd and BEven, 10.51 μm between BEven and BOdd, 63.0 μm between BOdd and B/WEven, and 31.5 μm between B/WEven and B/WOdd. Accordingly, in FIG. 2, the respective R, G, and B Even channels and Odd channels are illustrated in layers, one on top of the other, as a matter of convenience.

Figure 3:
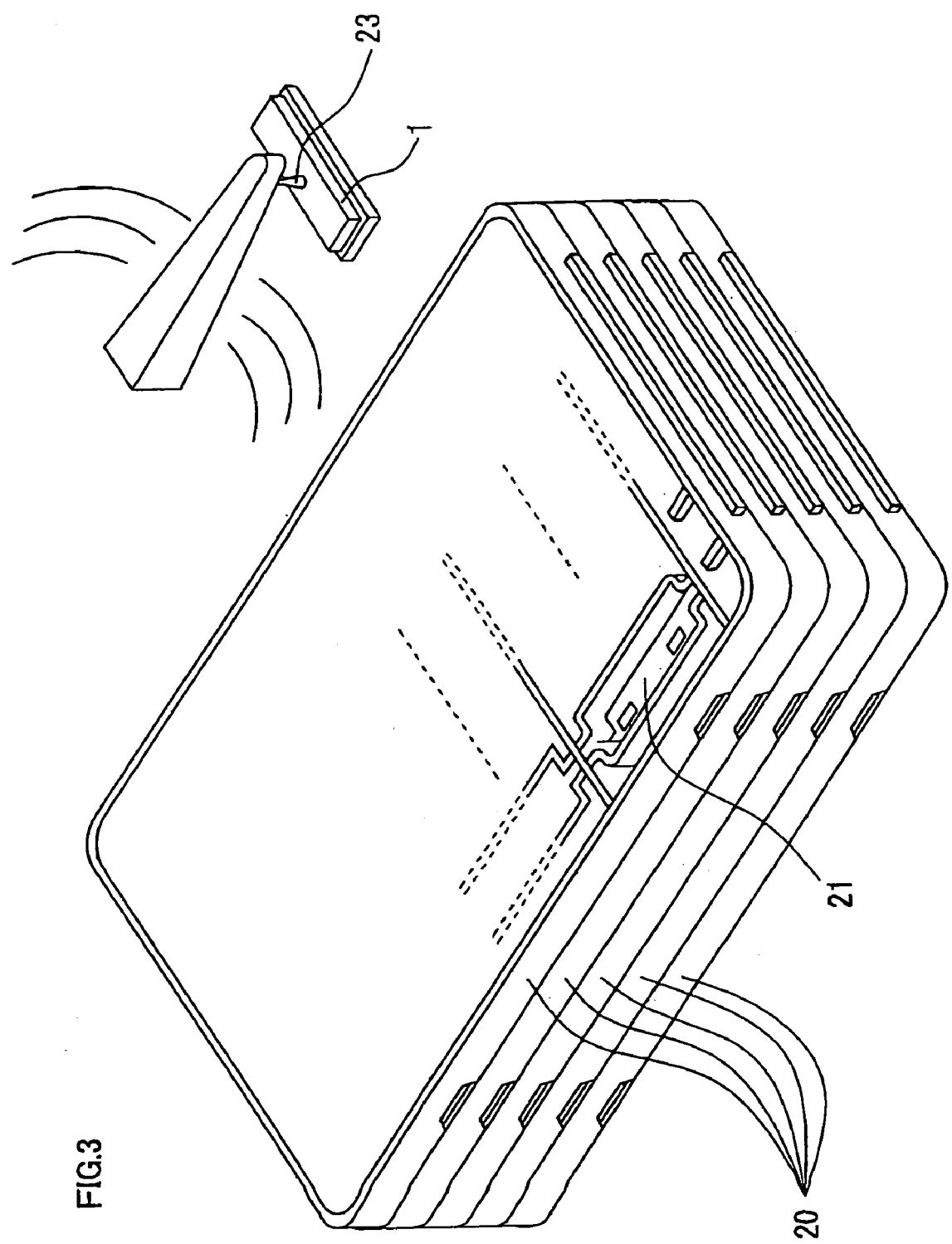
FIG. 3 is an explanatory view showing an automatic implementation process of the solid-state image sensing device.
Figure 4:
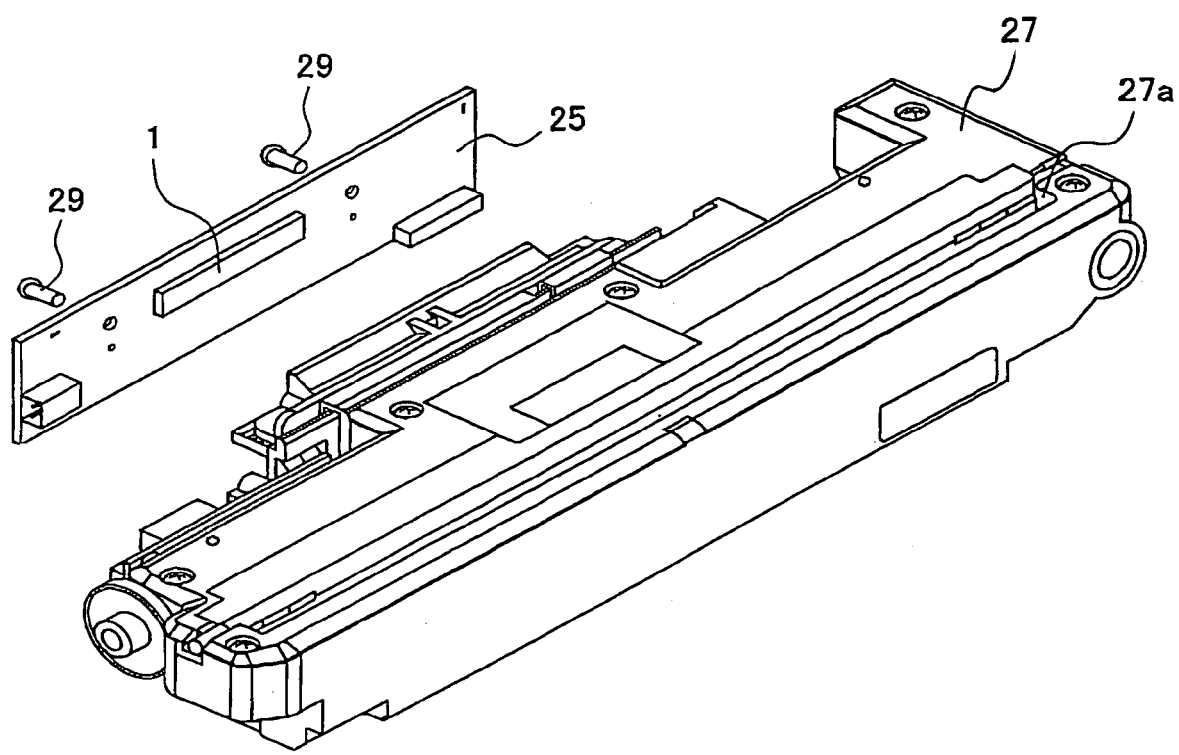
FIG. 4 is an explanatory view showing a process of attaching a printed-circuit board to a read head after the above automatic implementation.

The solid-state image sensing device 1 constituted as above is stored in one of storage units 21, provided in multiple numbers on a palette 20 as shown in FIG. 3. The device 1 is grasped by a suction device 23 of about φ5 mm in diameter to be automatically mounted on a printed-circuit board 25 as shown in FIG. 4. That is, solder cream is firstly applied to the printed-circuit board 25 and then, the solid-state image sensing device 1, grasped by the suction device 23, is mounted at an appropriate position on the printed-circuit board 25. In this manner, automatic installation of the device 1 is performed. At this time, the protective film 11 prevents the cover glass 10 from being defaced by the suction device 23 and the solder. Additionally, a plurality of palettes 20 are provided in stacks as shown in FIG. 3. When the uppermost palette 20 becomes empty, the palette 20 on the top is grasped and removed by a much larger suction device (not shown). The solid-state image sensing device 1 is then taken out from the next palette 20.

Figure 5:
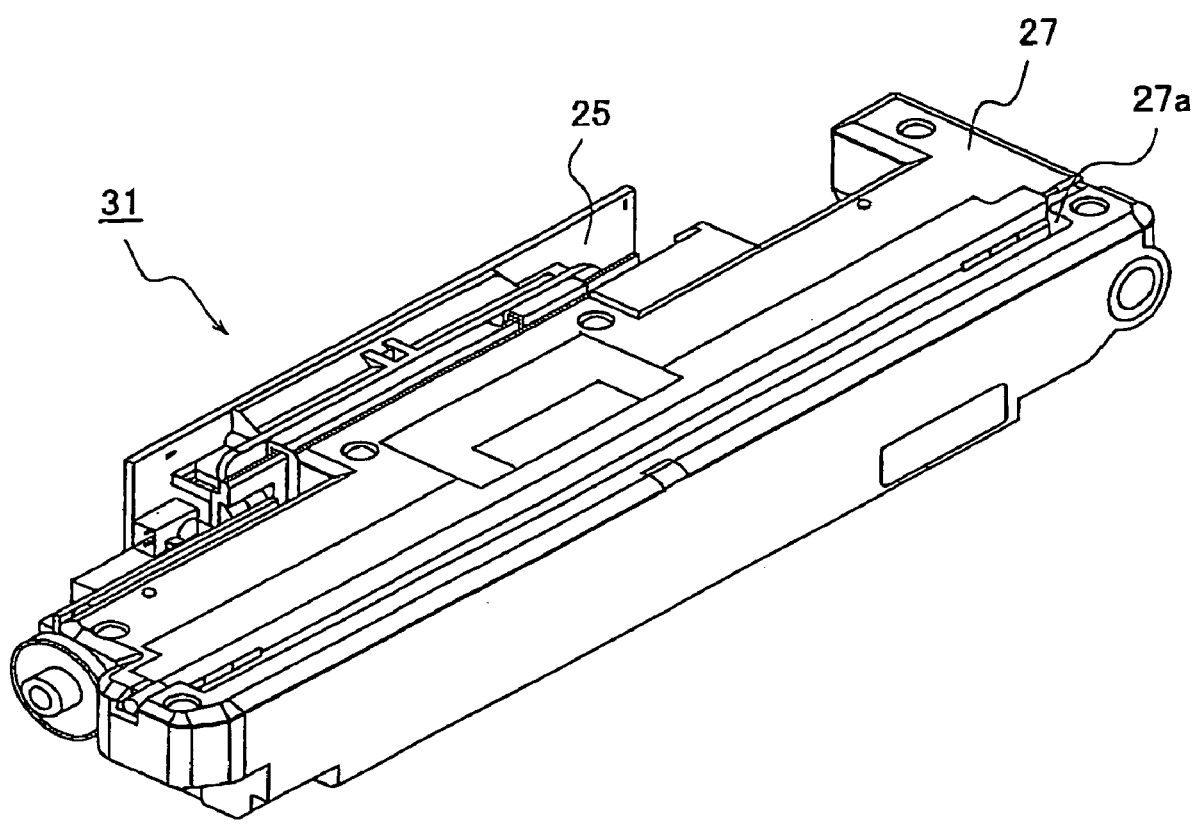
FIG. 5 is a perspective view showing a constitution of the read head obtained after the above attachment process.

The printed-circuit board 25, with the solid-state image sensing device 1 mounted thereon as previously described is attached to an attached section of a read head body 27 (apparatus), in fax and copy machines, via screws 29, etc. as shown in FIG. 4. The protective film 11 may be detached from the cover glass 10 after or before attaching the printed-circuit board 25 to the read head body 27 or, after or before attaching the solid-state image sensing device 1 to the printed circuit board 25. The read head body 27 incorporates various optical systems such as lenses and mirrors and collects reflections of light from a draft, etc. entered through a slit opening 27a in the light-receiving section 5. A read head 31 (CCD module) produced in this manner as an image read unit is shown in FIG. 5. The read head 31, after fitted to a later-explained imaging apparatus such as multifunctional apparatus etc., may read an image of a draft, etc. by moving itself in a direction orthogonal to the longitudinal direction of the slit opening 27*a* or by moving the draft, etc. above the slit opening 27*a*.

For one example, a constitution of a multifunctional apparatus (imaging apparatus) comprising the read head 31 is explained referring to FIGS. 6 to 9.

A multifunctional apparatus 61 is provided with faxing, scanning, copying and printing functions.

Figure 6:
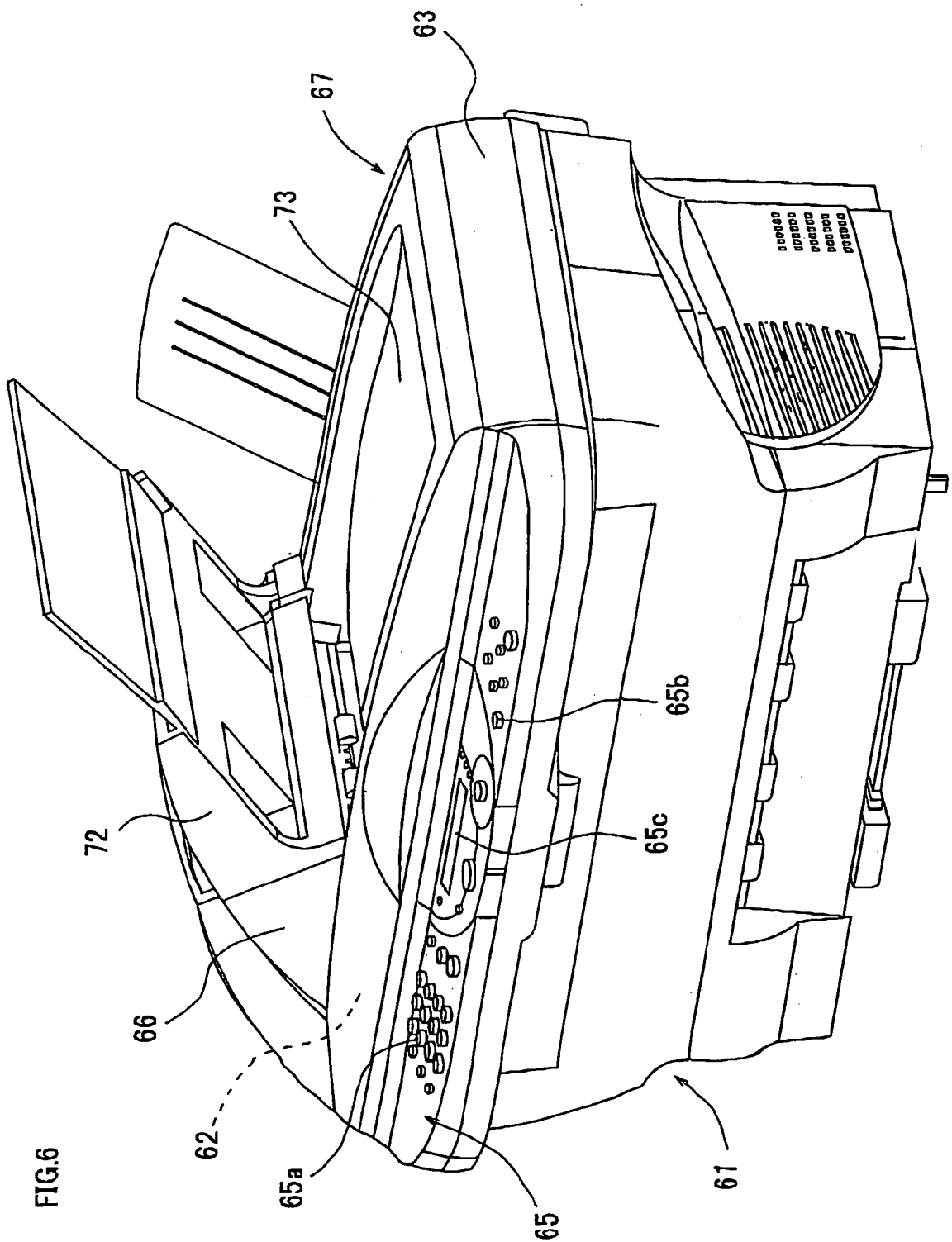
FIG. 6 is a perspective view showing a constitution of a multifunctional apparatus provided with the read head.
Figure 7:
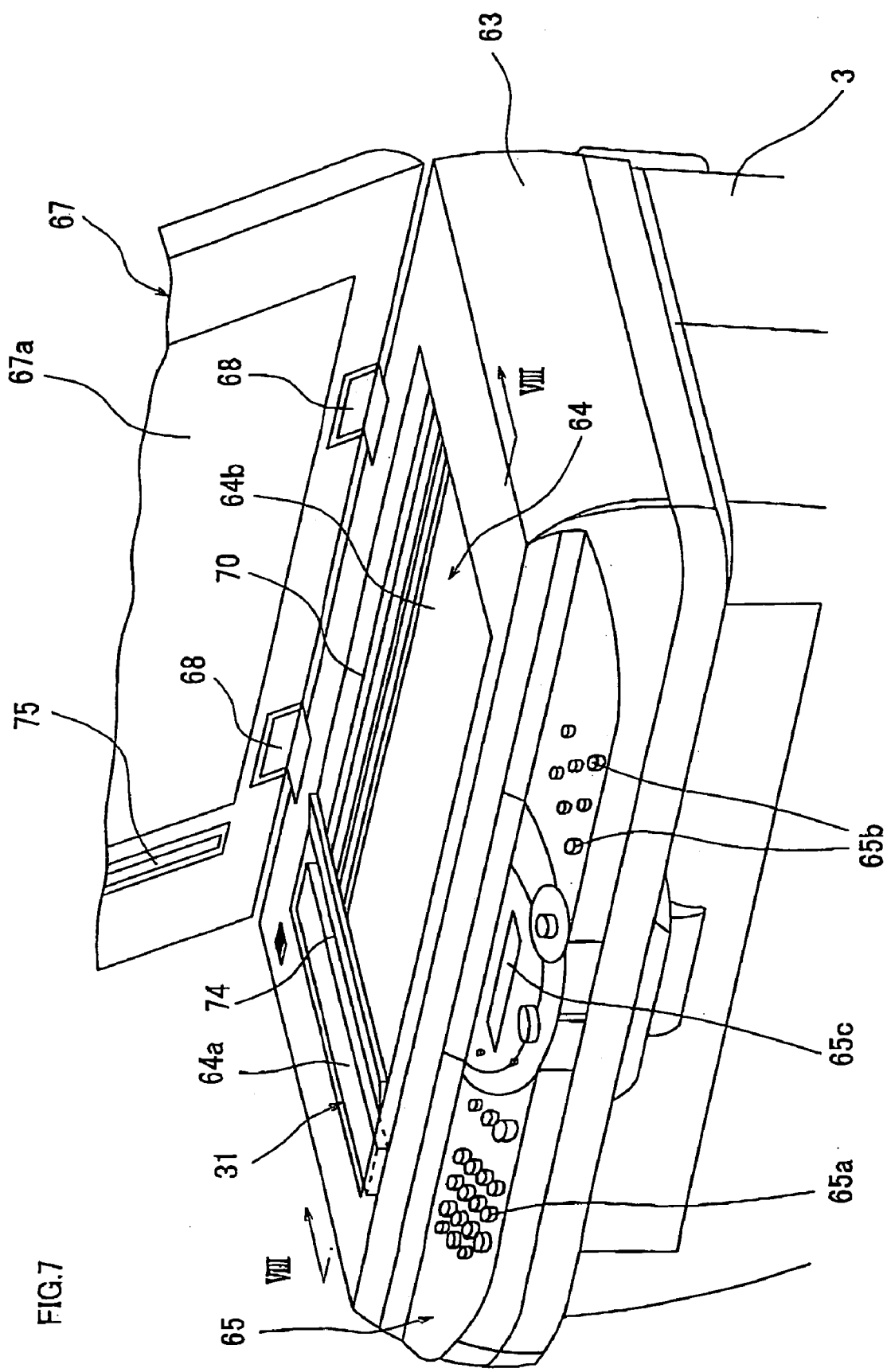
FIG. 7 is a partial perspective view showing a state in which a cover body of the multifunctional apparatus is opened and rotated with respect to a body case.

As shown in FIGS. 6 and 7, on the upper surface of a body case 63 as a chassis of the multifunctional apparatus 61, a large-sized glass board 64 for setting a draft thereon is fixed horizontally. In front of the glass board 64 on the upper surface of the body case 63, an operation panel 65 is arranged and is composed of ten keys 65*a* for executing faxing, scanning, copying functions, button keys 65*b* for inputting commands for various operations, a liquid crystal panel (LCD) 65*c* for displaying commands and error messages, etc. On the rear edge on the upper surface of the body case 63, a lid-like cover body 67 is attached via hinges 68 in a vertically pivotable manner.

The multifunctional apparatus 61 is provided with an image read apparatus 62. The image read apparatus 62 is a component for executing the scanning, copying and faxing functions in the multifunctional apparatus 61. The image read apparatus 62 is provided with the read head 31 that moves on the under surface of the large-sized glass board 64 of the body case 63. The large-sized glass board 64 is in the shape of rectangle. On the upper surface close to one of the narrow ends of the rectangle, a guide piece 74 is provided extending in length as much as the narrow end between the two wide ends. The guide piece 74 divides the longitudinal length of the large-sized glass board 64 into two sections. One is a portion of a glass board end 64*a* which is short in the read direction (the direction of arrow A in FIG. 8). The other is a central portion of the glass board which is long in the read direction, named draft setting table 64*b* (see FIGS. 7 and 8). A draft can be statically set on the draft setting table 64*b*.

Figure 8:
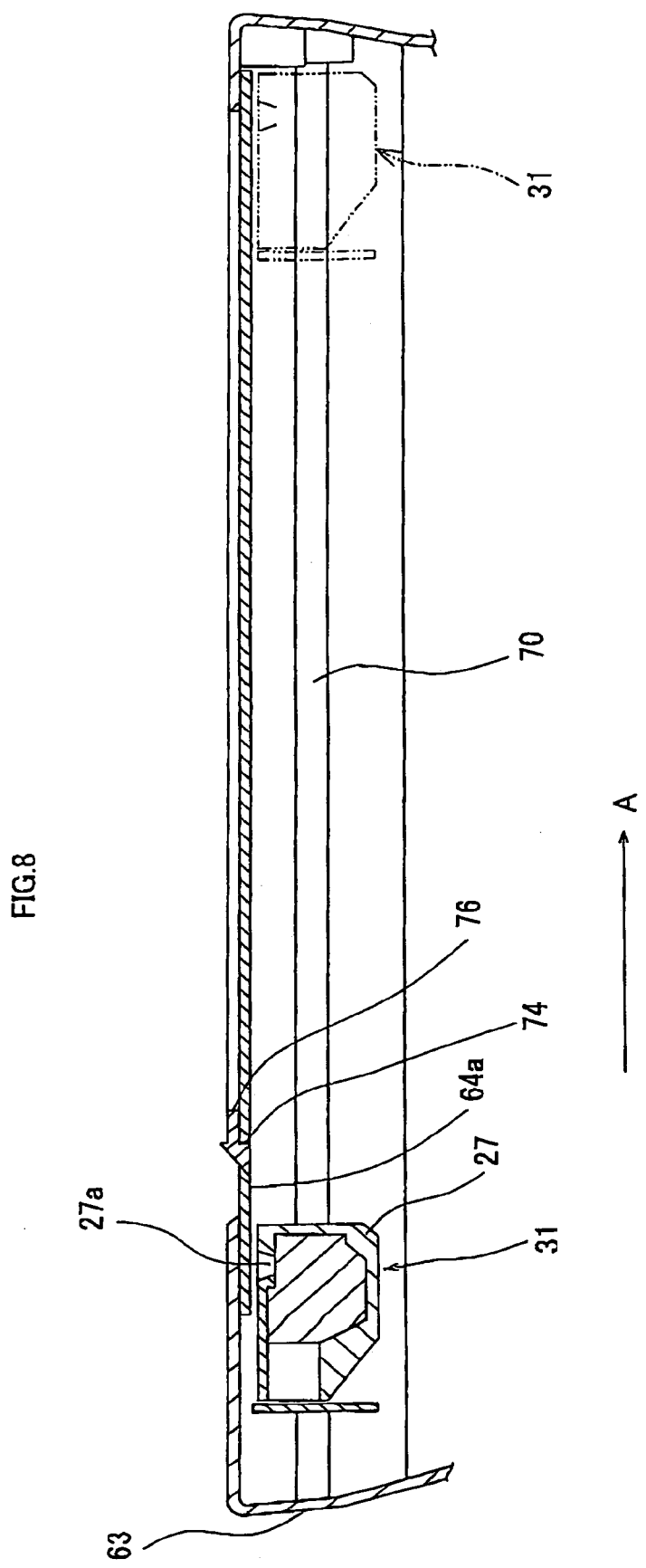
FIG. 8 is a sectional view taken along the line VIII—VIII in FIG. 7.

On the under surface side of the large-sized glass board 64, a pair of guide rails 70 are arranged in parallel to the read direction (in FIGS. 7 and 8, only one of the guide rails 70 is shown). The read head 31, together with the printed-circuit board 25 comprising the solid-state image sensing device 1, is configured to move back and forth freely on the guide rails 70. Drive control for moving the read head 31 is executed by a transmitter, like a timing belt and a step motor 89 (see FIG. 9). Additionally, the read head 31 is arranged in such a manner that the slit opening 27*a*, for receiving reflection of light from a draft, faces the draft surface. In a stand-by mode, the read head 31 is positioned at a move start position shown in FIG. 8.

The draft to be set on the draft setting table 64*b* is positioned in such a manner that a border edge (front end) of the draft on the upstream side (left as viewed in FIG. 8) with respect to the read direction abuts on a side edge of the guide piece 74 on the downstream side with respect to the read direction, i.e. a draft abutting end 76. In other words, first of all, the draft is set on the draft setting table 64*b* with the face, having an image to be scanned or copied, down. Then, the draft is held down by a retainer body 67*a* which is composed of sponge and white board provided on the under surface of the lid-like cover body 67. In that state, the read head 31, which has been static on the under surface side of the glass board end 64*a* in a stand-by mode, moves in the read direction (direction of arrow A in FIG. 8). When the read head 31 passes the under surface side of the draft setting table 64*b*, the image appearing on the draft set on the draft setting table 64*b* is read through the slit opening 27*a* by the light-receiving section 5 of the solid-state image sensing device 1.

Additionally, the image read apparatus 62 is configured to be capable of reading not only a draft set on the draft setting table 64*b* but also a draft fed automatically. In other words, in the present embodiment, drafts piled on a draft tray 72 of an automatic feed apparatus 66, provided on one end on the upper surface of the lid-like cover body 67, are separated one by one by a not shown feed roller inside the automatic feed apparatus 66 and transferred by a not shown transfer roller. Then, a part of the draft is continually exposed to the slip opening 75 facing the glass board end 64*a* in turn, while the read head 31, static on the under surface side of the glass board end 64*a*, reads the image on the drafts one after another. Subsequently, the drafts are transferred to a not shown discharge path inside the automatic feed apparatus 66 guided by the guide piece 74 and discharged to a discharge tray 73.

Figure 9:
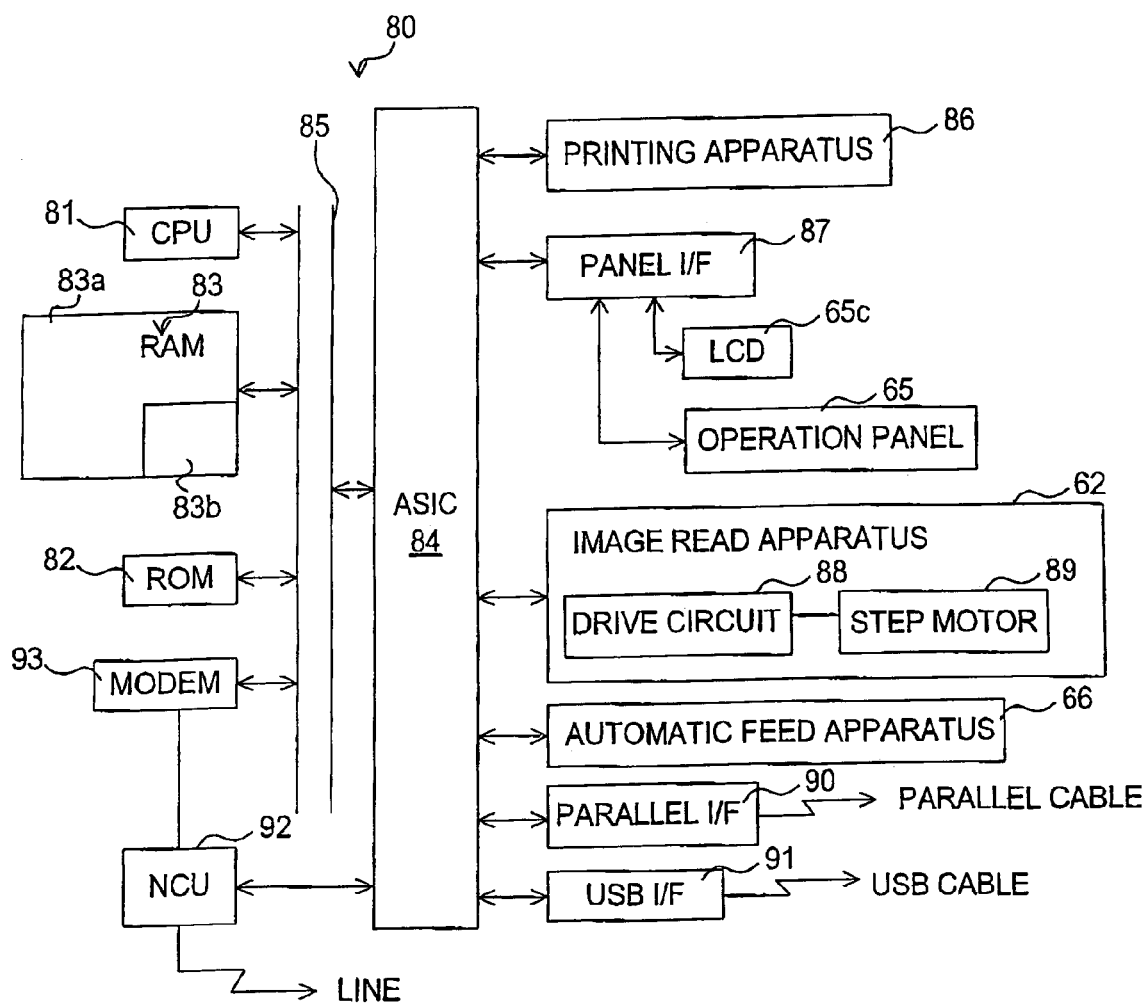
FIG. 9 is a functional block diagram showing a constitution of a control unit provided in the above multifunctional apparatus.

Next, a control unit 80 provided in the image read apparatus 62 is explained by way of the block diagram in FIG. 9. FIG. 9 is a functional block diagram of the control unit 80, which controls transfer operation of recording materials such as drafts. The control unit 80 is configured to mainly comprise a microcomputer as a control section having a CPU 81, a ROM 82 and a RAM 83. The control unit 80 also comprises an ASIC (application specific integrated circuit) 84. The control unit 80 controls overall operation executed in the multifunctional apparatus 61, other than the operation to be executed in the aforementioned image read apparatus 62 (multifunctional apparatus 61).

As shown in FIG. 9, in the control unit 80, the CPU 81 for performing various calculations and control, the ROM 82 for storing programs, parameters and not shown lookup tables necessary for the control by the CPU 81, the RAM 83 including a plurality of memory areas like an area 83*a* for storing the read image data, an area 83*b* for storing various data such as the size of a draft (length with respect to the read direction), image area length, image read mode, etc., and the ASIC 84 are connected to each other via a bus 85.

To the ASIC 84, a printing apparatus 86, a panel interface 87 for the aforementioned operation panel 65 and liquid crystal panel 65*c*, a drive circuit 88 for the step motor 89 which moves the read head 31 of the image read apparatus 62, the automatic feed apparatus 66, a parallel interface 90 for input/output of image information to/from not shown external personal computers (PC), a USB interface for input/output of the image information to/from external apparatus such as digital cameras, a network control unit (NCU) for transmitting/receiving information to/from external faxes via general public lines, and a modem 93 are connected. To the USB interface 91, external PCs may be connected.

Here, in the solid-state image sensing device 1 applied to the read head 31 (and further, the multifunctional apparatus 61) as previously described, the protective film 11 is made to adhere as in the aforementioned manner. Accordingly, upon attaching the solid-state image sensing device 1 to the read head body 27, the protective film 11 is taken off from the cover glass 10 without performing any surface processing such as cleaning to the surface of the cover glass.

That is, the adhesion section between the cover glass 10 and the protective film 11 is provided so as to keep clear of the front face (especially the front of the line sensors 3) of the light-receiving section 5. Therefore, even if no surface processing, such as cleaning for removing the adhesive, is performed to the cover glass 10, the light received by the light-receiving section 5, entering through the cover glass 10, is not affected by the residual adhesive. Therefore, according to the present embodiment, the trouble of removing the adhesive can be dispensed with when the solid-state image sensing device 1 is attached to the read head body 27. Furthermore, image reading using the solid-state image sensing device 1 can be performed favorably without being affected by the residual adhesive.

Moreover, the adhesion section between the cover glass 10 and the protective film 11 is provided on the whole circumferential area of the cover glass 10. Therefore, dust entering to the front face of the light-receiving section 5 can be prevented until the attachment of the solid-state image sensing device 1 begins. Furthermore, as a result of the above, after the attachment of the solid-state image sensing device 1, image reading using the solid-state image sensing device 1 can be performed more satisfactorily. Accordingly, in the present embodiment, manufacturing of the read head 31 (and consequently, multifunctional apparatus 61) becomes easy. Moreover, the manufacturing costs are reduced and the accuracy of reading an image by the read head 31 (and furthermore, multifunctional apparatus 61) can be improved.

It is to be noted that the present invention is not limited to the above embodiment, and can be practiced in various manners within the scope of the present invention.

For instance, as long as the adhesion between the cover glass 10 and the protective film 11 is provided so as to avoid the front face of the light-receiving section 5, omission of the trouble of removing the adhesive is possible in the same manner as in the above embodiment.

Figure 10A:
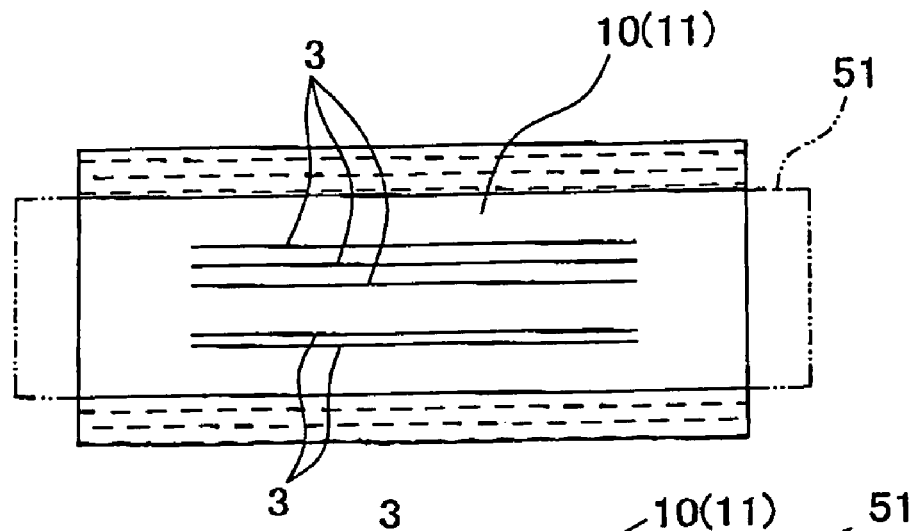
FIGS. 10A to 10C are plan views showing modifications of an adhesive section in the above solid-state image sensing device.

Accordingly, as shown hatched in FIG. 10A, the adhesion sections may be provided along the pair of wide ends of the rectangular cover glass 10. Or, as shown hatched in FIG. 10B, the adhesion sections may be provided along the pair of narrow ends of the rectangular cover glass 10. Or, there may be provided dotted adhesion sections, as shown hatched in FIG. 10C, in the circumferential area of the cover glass 10.

Additionally, if a second protective film without any adhesive applied on at least one surface facing the cover glass is arranged in an area other than the above adhesion section of the cover glass 10 previously described, the manner of application of the adhesive to the protective film 11 can be rough or less controlled. In this case, the second protective film prevents undesirable sticking of the adhesive to the front face of the light-receiving section 5 of the cover glass 10. Accordingly, in this case, the adhesive may be applied to an approximate range including the area corresponding to the above hatched sections of the protective film 11. Or the adhesive may be applied to the whole protective film 11. Accordingly, if such a constitution is adopted, manufacturing of the solid-state image sensing device 1 becomes much easier.

Figure 11A:
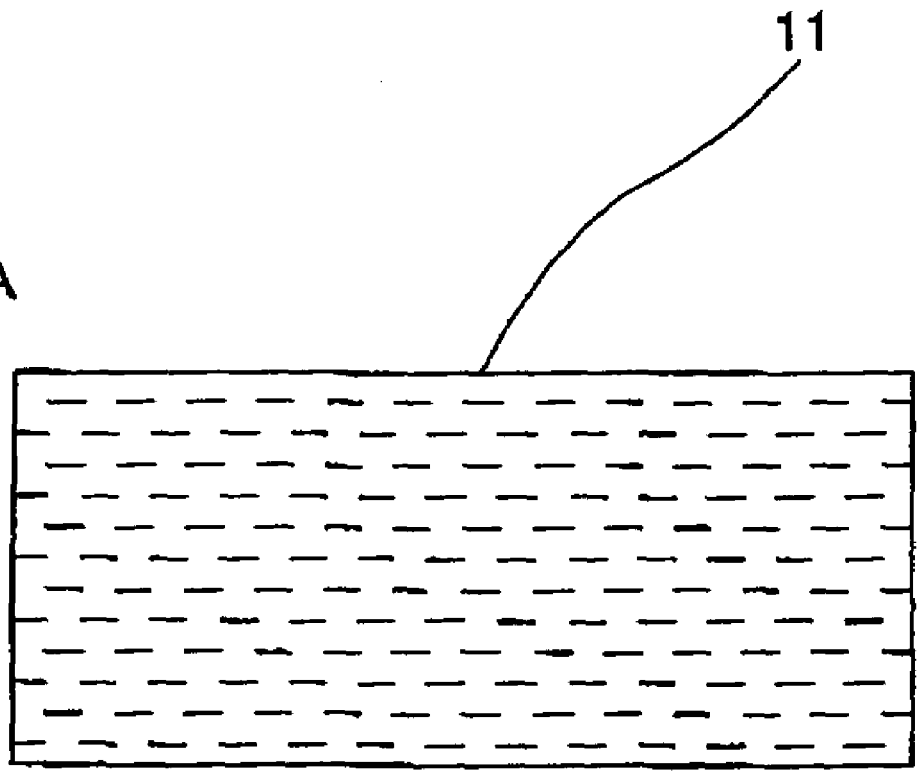
FIGS. 11A and 11B are plan views showing a modification of a protective member in the above solid-state image sensing device.
Figure 11B:
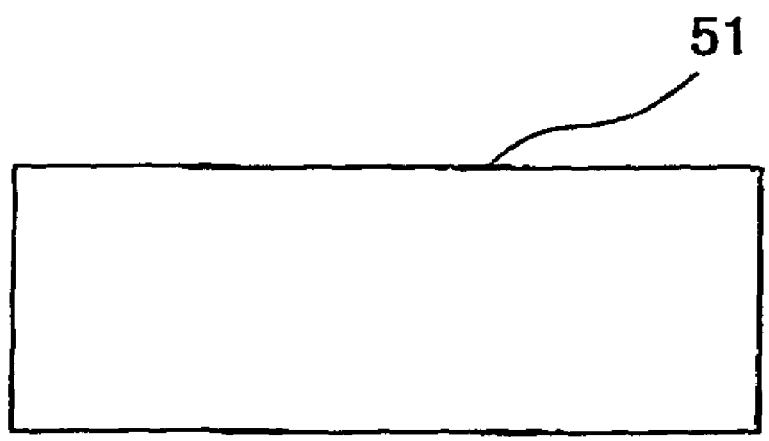

For example, the protective film 11 to which the adhesive is wholly applied as shown in FIG. 11A and the second protective film 51 shaped similar to the film 11 as shown in FIG. 11B are prepared. If the protective film 11, with the second protective film 51 arranged in the center thereof, is made to adhere to the cover glass 10, a solid-state image sensing device having the same effect as the embodiment shown in FIGS. 1 and 2 can be obtained. In this case, the second protective film 51 may be first laid in the center of the protective film 11 and then the protective film 11 together with the second protective film 51 may be made to adhere to the cover glass 10. Or the second protective film 51 may be first laid on the cover glass 10 and then the protective film 11 may be made to adhere to the cover glass 10.

Figure 10B:
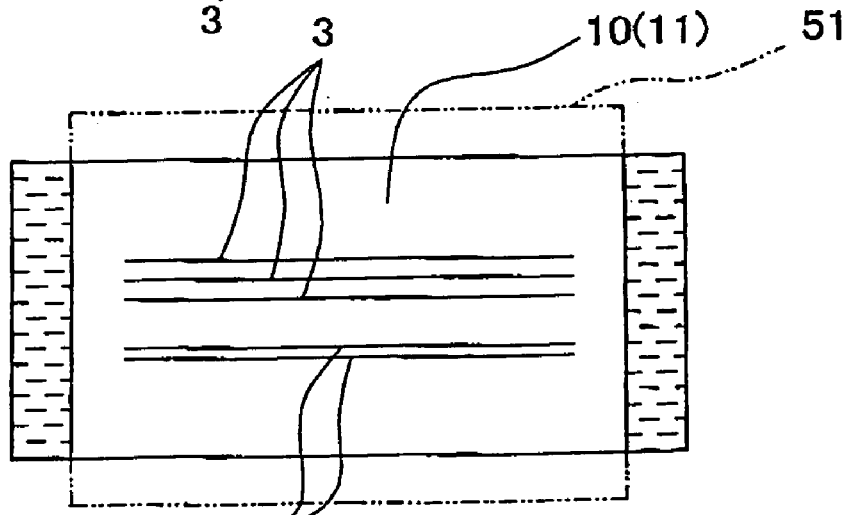
Figure 10C:
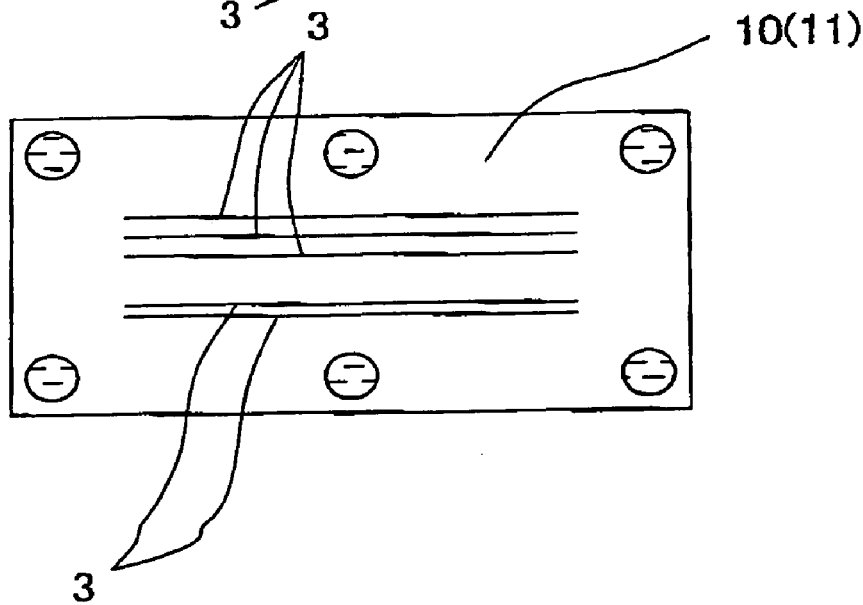

Furthermore, as the protective film 51 shows in FIGS. 10A and 10B, at least a part of the edge of the second protective film may protrude from the cover glass 10 surface. In this case, by picking up the part of the protective film 51 protruding from the cover glass 10 surface, the protective film 11 can be easily taken off from the cover glass 10.

Figure 12A:
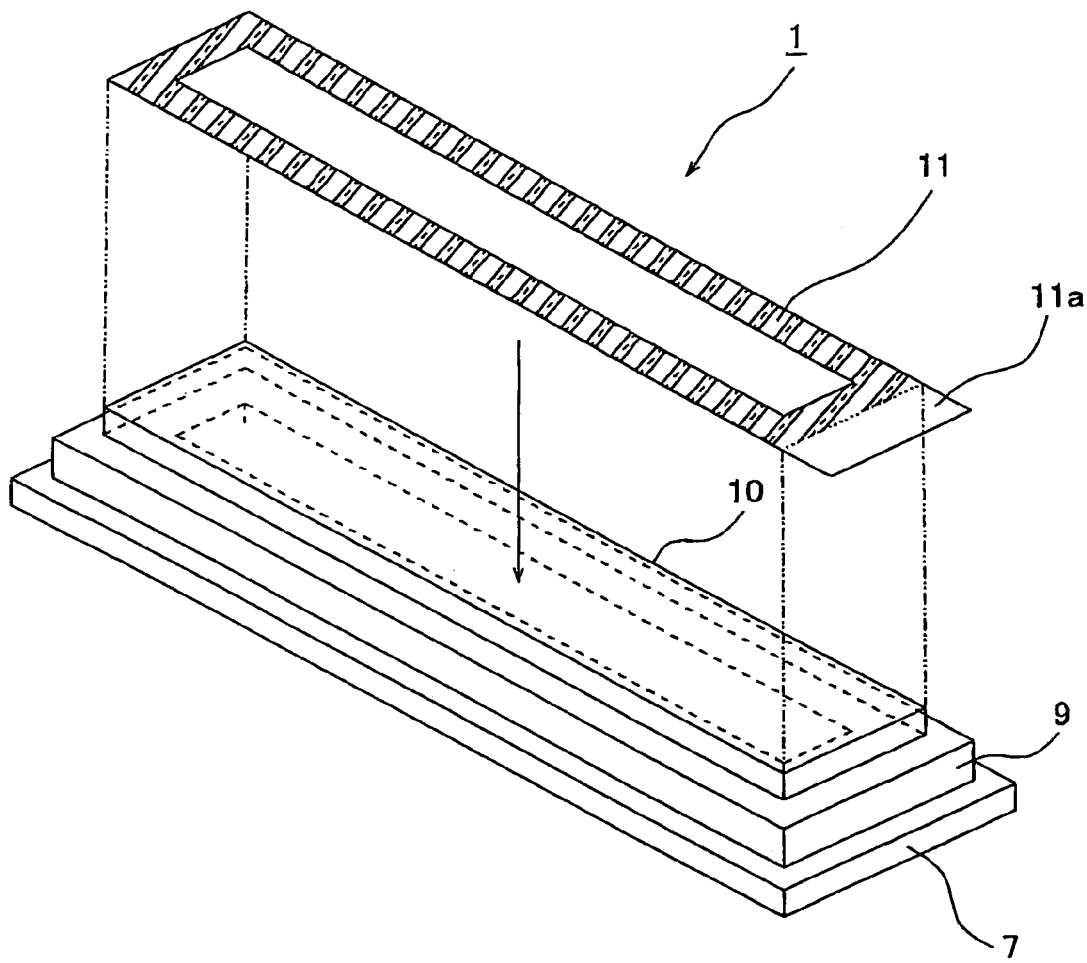
FIG. 12A is an exploded perspective view and FIG. 12B is a transverse sectional view showing a constitution of a modification of the above solid-state image sensing device.
Figure 12B:
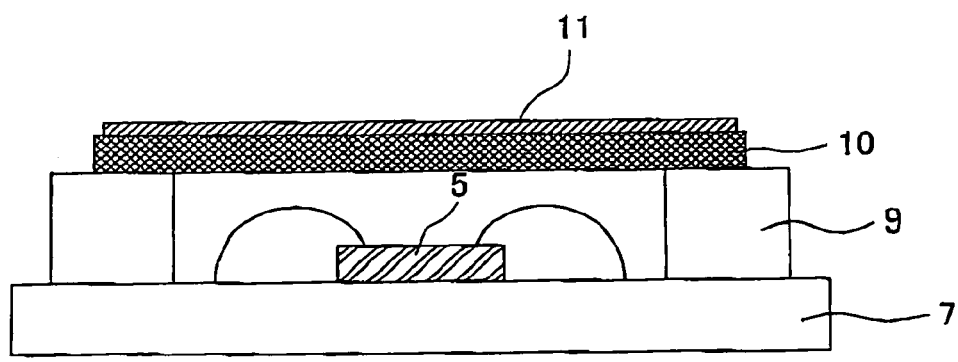
Figure 13B:
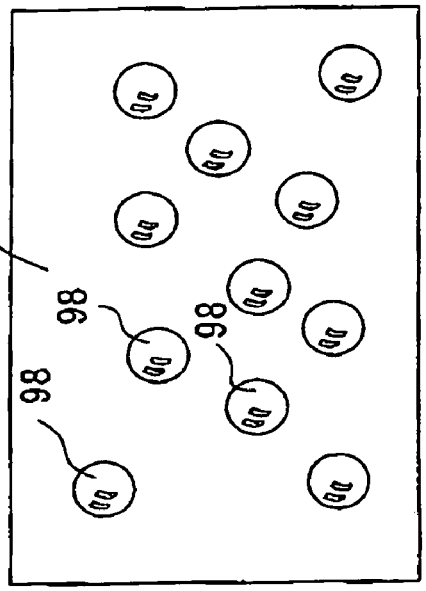
FIGS. 13A to 13D are explanatory views showing problems in prior art.
Figure 13D:
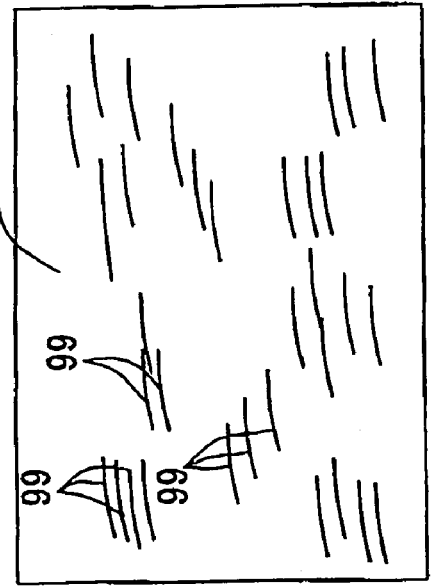
Figure 13A:
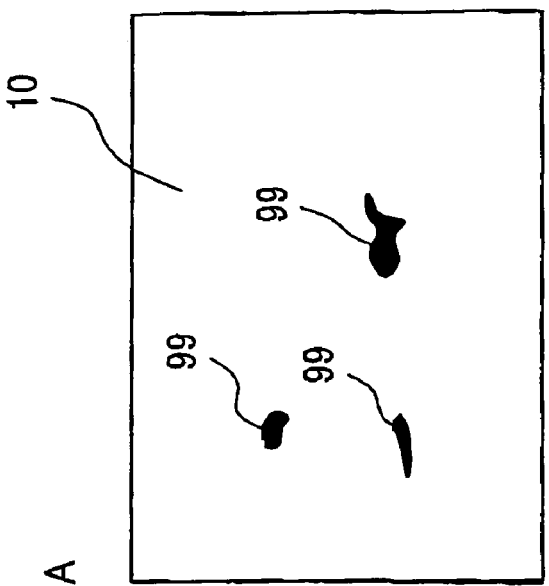
Figure 13C:
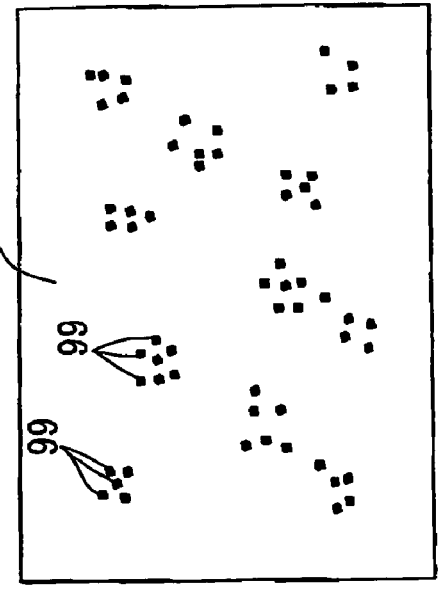

Furthermore, regardless of whether the second protective film is provided or not, at least a part 11a of the first protective film 11 may protrude from the cover glass 10 surface as shown in FIG. 12A. In this case, by holding the protruding part 11a of the protective film 11, the protective film 11 can be easily taken off from the cover glass 10.

Moreover, for example, as shown in FIG. 12A, the protruding part 11a of the protective film 11 may be set to protrude only from one end of the rectangular cover glass 10. Then, this protruding part 11a can be a mark that indicates the direction of the solid-state image sensing device 1.

Accordingly, in case the protruding part 11a is used as a mark, mistaking the direction of the solid-state image sensing device 1 with respect to the printed-circuit board 25 can be prevented when fitting the device 1 to the printed-circuit board 25.

That is, for example, there are cases in which a plurality of numbered electrodes such as pins, etc. are provided on the back or sides of the solid-state image sensing device 1. When such a solid-state image sensing device 1, like a chip module, is to be fitted to the printed-circuit board 25, it is necessary that the respective electrodes provided on the solid-state image sensing device 1 are correctly fitted to the regions where the electrodes should be connected. For example, a common chip module other than the solid-state image sensing device 1 often has a mark on the upper surface of the chip module indicating which of a plurality of electrodes is the "1 pin" (first pin). In this case, by locating the mark, the respective electrodes are accurately connected to the corresponding connection regions. However, in case of the present solid-state image sensing device 1, there is the cover glass 10 arranged on the upper surface of the solid-state image sensing device 1. Therefore, it is difficult to put a mark on the upper surface of the device 1. On the other hand, as shown in FIG. 12A, if a configuration is adopted so that the part 11a of the protective film 11 protrudes from one end of the rectangular cover glass 10, the protruding part 11a can be used as a mark for acknowledging the position of the "1 pin". That is, use of the protruding part 11a allows accurate fitting between the respective electrodes provided on the solid-state image sensing device 1 and the corresponding connection regions on the printed-circuit board 25. The protruding part 11a may be a part of the second protective film 51.

As above, at least one of the first and second protective films may have the part protruding from the cover glass 10 surface. However, it is also acceptable that neither of the first and second protective films protrudes from the cover glass 10 surface.

If the protective film does not protrude from the cover glass 10 surface as above, unexpected problems like disarranging the shape of the adhesive on the adhesion section by inadvertent contact of the protruding part to other members can be prevented. Necessity of the removal of the adhesive is further decreased.

In the previous embodiment, the cover glass 10 made of borosilicate glass was used as the cover member. However, the cover member may be transparent resin like acryl, etc.

Either bond or paste can be used as the adhesive. Also, the present invention can be applied not only to solid-state image sensing devices of CCD line sensor type, but also to those of CCD area sensor type, which have been commonly used with digital cameras or digital video cameras in recent years.

Moreover, the present invention can be applied to solid-state image sensing devices of CIS type or those of CMOS image sensor type. Among the above devices, the solid-state image sensing devices of CIS type are considerably larger than those of CCD type, in general. Therefore, it is necessary that the protective film 11 is large enough to cover a cover member having a certain level of largeness. Additionally, in the conventional solid-state image sensing devices of CCD type, the distance between the light-receiving section and the cover glass is narrow. Therefore, the influence of the residual adhesive appears all the more conspicuously. Also, since the residual adhesive is heated upon the automatic fitting of the solid-state image sensing device to the printed-circuit board 25, the removal of the adhesive is more difficult. However, in the previous embodiment, the problem of removing the adhesive can be omitted. Moreover, image reading using the solid-state image sensing device 1 is not affected by the residual adhesive. Accordingly, in the solid-state image sensing devices of CCD type, the advantageous effects of the present invention are more readily shown.

What is claimed is:

1. A solid-state image sensing device comprising:
   a light-receiving section that generates electric signals when subjected to light;
   a cover member that covers the light-receiving section from a light-receiving side and allows light to pass through to the light-receiving section; and
   a protective member that is adhered to the surface of the light-receiving side of the cover member in a detachable manner, wherein
   an adhesion section between the cover member and the protective member is provided on at least a portion of a circumferential area of the cover member, and wherein the front face of the light-receiving section is kept clear of adhesive, and
   wherein the protective member comprises an outer protective film and an inner protective film, an adhesive is applied to at least a portion of the outer protective film facing the circumferential area of the cover member, and the inner protective film without any adhesive is provided between the outer protective film and the cover member on a section, of the outer protective film, facing the front face of the light-receiving section.

2. The solid-state image sensing device according to claim 1, wherein said adhesion section is provided on the whole circumferential area of the cover member.

3. The solid-state image sensing device according to claim 1, wherein said inner protective film is arranged in such a manner that at least a part of the edge of the inner protective film protrudes from the surface of the cover member.

4. The solid-state image sensing device according to claim 1, wherein said outer protective film is adhered to the cover member in such a manner that at least a part of the edge of the outer protective film protrudes from the surface of the cover member.

5. The solid-state image sensing device according to claim 1, wherein said light-receiving section is constituted of photoelectric conversion devices.

6. An imaging apparatus that adopts a solid-state image sensing device comprising:
   a light-receiving section that generates electric signals when subjected to light;
   a cover member that covers the light-receiving section from a light-receiving side and allows light to pass through to the light-receiving section; and
   a protective member that is adhered to the surface of the light-receiving side of the cover member in a detachable manner,
   an adhesion section between the cover member and the protective member being provided on a circumferential area of the cover member, and wherein the front face of the light-receiving section is kept clear of adhesive, and
   wherein the protective member comprises an outer protective film and an inner protective film, an adhesive is applied to at least a portion of the outer protective film facing the circumferential area of the cover member, and the inner protective film without any adhesive is provided between the outer protective film and the cover member on a section, of the outer protective film, facing the front face of the light-receiving section.

7. The imaging apparatus according to claim 6 comprising:
   an image read unit that adopts the solid-state image sensing device;
   a control section that controls the image read unit; and
   a chassis in which the image read unit and the control section is accommodated.

8. An image read unit for an imaging apparatus that adopts a solid-state image sensing device comprising:
   a light-receiving section that generates electric signals when subjected to light;
   a cover member that covers the light-receiving section from a light-receiving side and allows light to pass through to the light-receiving section; and
   a protective member that is adhered to the surface of the light-receiving side of the cover member in a detachable manner,
   an adhesion section between the cover member and the protective member being provided on a circumferential area of the cover member, and wherein the front face of the light-receiving section is kept clear of adhesive, and
   wherein the protective member comprises an outer protective film and an inner protective film, an adhesive is applied to at least a portion of the outer protective film facing the circumferential area of the cover member, and the inner protective film without any adhesive is provided between the outer protective film and the cover member on a section, of the outer protective film, facing the front face of the light-receiving section.

9. A solid-state image sensing device comprising:
   a light-receiving section that generates electric signals when subjected to light;
   a cover member that covers the light-receiving section from a light-receiving side;
   a protective member that is adhered to the surface of the light-receiving side of the cover member in a detachable manner;
   wherein the cover member is at least translucent;
   wherein an adhesion section between the cover member and the protective member is defined on at least a portion of a circumferential area of the cover member;
   wherein an adhesive is applied to at least one of the cover member and the protective member in the adhesion section;
   wherein an area of the cover member providing access for light to reach the light-receiving section is kept clear of adhesive, and wherein the protective member comprises an outer protective film and an inner protective film, and an adhesive is applied to at least the adhesion section of the outer protective film; and wherein the inner protective film with at least one surface free of adhesive is provided between the outer protective film and the cover member; and wherein the inner protective film is located so as to at least cover the area of the cover member providing access for light to reach the light-receiving section.

10. The solid-state image sensing device according to claim 9, wherein said adhesion section is provided on the whole circumferential area of one of the cover member and the protective member, wherein the circumferential area is defined as a perimeter of the surface of the light-receiving side of the cover member not including the area of the cover member providing access for light to reach the light receiving section.

11. The solid-state image sensing device according to claim 9, wherein the at least one surface free of adhesive of the inner protective film is in contact with the cover member.

12. The solid-state image sensing device according to claim 11, wherein said inner protective film has at least a portion of an edge protruding from at least an edge of at least one of said cover member and said outer protective film.

13. The solid-state image sensing device according to claim 9, wherein said protective member has at least a portion of an edge protruding from the surface of the cover member.

14. The solid-state image sensing device according to claim 9, wherein said light-receiving section is constituted of photo electric conversion devices.

15. The solid-state image sensing device according to claim 9, wherein said cover member is transparent.

16. An imaging apparatus that adopts a solid-state image sensing device comprising:

a light-receiving section that generates electric signals when subject to light;

a cover member that covers the light-receiving section from a light-receiving side; and a protective member that is made to adhere to the surface of the light-receiving side of the cover member in a detachable manner, and an adhesion section between the cover member and the protective member being provided on at least a portion of a circumferential area of the cover member, not including the an area corresponding to the front face of the light-receiving section, wherein the cover member allows light to pass through to the light-receiving section, and wherein the protective member comprises an outer protective film and an inner protective film, and an adhesive is applied to at least the adhesion section of the outer protective film; and wherein the inner protective film with at least one surface free of adhesive is provided between the outer protective film and the cover member; and wherein the inner protective film is located so as to at least cover the area of the cover member providing access for light to reach the light-receiving section.

17. The imaging apparatus according to claim 16 comprising:

an image read unit that adopts the solid-state image sensing device;

a control section that controls the image read unit; and a chassis in which the image read unit and the control section is accommodated.

18. An image read unit for an imaging apparatus that adopts a solid-state image sensing device comprising:

a light-receiving section that generates electric signals when subjected to light;

a cover member that covers the light-receiving section from a light-receiving side; and a protective member that is made to adhere to the surface of the light-receiving side of the cover member in a detachable manner, an adhesion section between the cover member and the protective member provided on a circumferential area of the cover member, keeping clear of the front face of the light-receiving section, wherein the cover member is at least translucent, and wherein the protective member comprises an outer protective film and an inner protective film, and an adhesive is applied to at least the adhesion section of the outer protective film; and wherein the inner protective film with at least one surface free of adhesive is provided between the outer protective film and the cover member; and wherein the inner protective film is located so as to at least cover the area of the cover member providing access for light to reach the light-receiving section.

19. A solid-state image sensing device comprising:

a light-receiving section that generates electric signals when subjected to light;

a cover member that covers the light-receiving section;

a protective member that is adhered to the surface of the light-receiving side of the cover member in a detachable manner;

wherein the cover member is not opaque;

wherein an adhesion section between the cover member and the protective member is defined on at least a portion of a circumferential area of the cover member;

wherein an adhesive is applied to one of the cover member and the protective member in the adhesion section;

wherein an area of the cover member providing access for light to reach the light-receiving section is kept free of adhesive; and wherein the protective member comprises an outer protective film and an inner protective film, and an adhesive is applied to at least the adhesion section of the outer protective film; and wherein the inner protective film with at least one surface free of adhesive is provided between the outer protective film and the cover member; and wherein the inner protective film is located so as to at least cover the area of the cover member providing access for light to reach the light-receeiving section.

* * * * *